(12) United States Patent
Ohta

(10) Patent No.: US 7,196,396 B2
(45) Date of Patent: Mar. 27, 2007

(54) SEMICONDUCTOR DEVICE HAVING STI WITHOUT DIVOT AND ITS MANUFACTURE

(75) Inventor: Hiroyuki Ohta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 17 days.

(21) Appl. No.: 11/268,499

(22) Filed: Nov. 8, 2005

(65) Prior Publication Data

US 2006/0108661 A1    May 25, 2006

Related U.S. Application Data

(62) Division of application No. 10/721,080, filed on Nov. 26, 2003.

(30) Foreign Application Priority Data

Dec. 26, 2002    (JP) ............... 2002-376009

(51) Int. Cl.
*H01L 29/00* (2006.01)
*H01L 21/336* (2006.01)

(52) U.S. Cl. ............... 257/510; 257/506; 257/E21.54; 257/E21.545; 438/294; 438/248

(58) Field of Classification Search ............... 257/510, 257/506, 507, 508, 509, E21.54, E21.545; 438/294, 248
See application file for complete search history.

(56) References Cited

U.S. PATENT DOCUMENTS

| 6,140,207 | A  | * | 10/2000 | Lee ............... 438/427 |
| 6,333,547 | B1 |   | 12/2001 | Tanaka et al. |
| 6,683,354 | B2 |   | 1/2004  | Heo et al. |
| 6,828,646 | B2 | * | 12/2004 | Marty et al. ............... 257/501 |

2004/0115897 A1    6/2004    Inoue et al.

FOREIGN PATENT DOCUMENTS

| JP | 63-316442  | 12/1988 |
| JP | 64-075664  | 3/1989  |
| JP | 01-176067  | 7/1989  |
| JP | H01-282836 | 11/1989 |
| JP | H01-315161 | 12/1989 |
| JP | 05-062971  | 3/1993  |

(Continued)

OTHER PUBLICATIONS

Office Action dated May 17, 2005 with Translation (JP2002-376009).

(Continued)

*Primary Examiner*—Long K. Tran
(74) *Attorney, Agent, or Firm*—Westerman, Hattori, Daniels & Adrian, LLP.

(57) ABSTRACT

The method of manufacturing a semiconductor device has the steps of: etching a semiconductor substrate to form an isolation trench by using as a mask a pattern including a first silicon nitride film and having a window; depositing a second silicon nitride film covering an inner surface of the isolation trench; forming a first silicon oxide film burying the isolation trench; etching and removing the first silicon oxide film in an upper region of the isolation trench; etching and removing the exposed second silicon nitride film; chemical-mechanical-polishing the second silicon oxide film; and etching and removing the exposed first silicon nitride film.

5 Claims, 16 Drawing Sheets

FOREIGN PATENT DOCUMENTS

| | | |
|---|---|---|
| JP | 11-297812 | 10/1999 |
| JP | 2000-269510 | 9/2000 |
| JP | 2002-203895 | 7/2002 |
| JP | 2002-208629 | 7/2002 |
| JP | 2002-289683 | 10/2002 |

OTHER PUBLICATIONS

English Translation of Japanese Office Action dated Oct. 3, 2006 (mailing date), issued in corresponding Japanese Patent Application No. 2002-376009.

* cited by examiner

SEMICONDUCTOR DEVICE HAVING STI WITHOUT DIVOT AND ITS MANUFACTURE

CROSS REFERENCE TO RELATED APPLICATION

This application is based on and claims priority of Japanese Patent Application No. 2002-376009 filed on Dec. 26, 2002, the entire contents of which are incorporated herein by reference. This application is a divisional of prior application Ser. No. 10/721,080, filed on Nov. 26, 2003.

BACKGROUND OF THE INVENTION

A) Field of the Invention

The present invention relates to a semiconductor device and its manufacture method, and more particularly to a semiconductor device having shallow trench isolation (STI) and its manufacture method.

B) Description of the Related Art

Local oxidation of silicon (LOCOS) has been used as isolation of a semiconductor device.

According to LOCOS techniques, after a silicon oxide film is formed on a silicon substrate as a buffer layer, a silicon nitride film is formed as a mask layer for preventing oxidization. After the silicon nitride film is patterned, the surface of the silicon substrate is selectively and thermally oxidized via the silicon oxide film.

Oxidizing species such as oxygen and moisture enter not only a silicon region under an opening of the silicon nitride film (isolation region) but also a silicon region under the buffer silicon oxide layer under the nitride layer (active region) adjacent to the opening, when the silicon substrate is thermally oxidized. These oxidizing species oxidize the silicon substrate surface even under the silicon nitride film and a silicon oxide region called birds' beak is formed. This bird's beak region cannot be substantially used as an active region for forming electronic elements so that the area of the active region is reduced.

A silicon nitride film having apertures of various sizes is formed on a silicon substrate and the substrate surface is thermally oxidized. In this case, a silicon oxide film formed on the silicon substrate surface and in the small size aperture is thinner than a silicon oxide film formed on the silicon substrate surface and in the large size aperture. This phenomenon is called thinning.

As a semiconductor device becomes miniaturized, a ratio of an area not used as the electronic element forming region to a total area of a semiconductor substrate increases. Namely, a ratio of the area unable to be used for the electronic element forming region, due to bird's beak or thinning, increases, hindering high integration of a semiconductor device.

Trench isolation (TI) techniques are known as isolation region forming techniques. According to TI techniques, a trench is formed in the surface layer of a semiconductor substrate and insulator or polysilicon is buried or embedded in the trench. This method has been used for forming a bipolar transistor LSI which requires deep isolation regions.

Trench isolation is being applied to a MOS transistor LSI because both bird's beak and thinning do not occur. MOS transistor LSI's do not require deep isolation regions like bipolar transistor LSI's and can use relatively shallow isolation regions having a depth of about 0.1 to 1.0 µm. This structure is called shallow trench isolation (STI).

STI forming processes will be described with reference to FIGS. 11A to 11G.

As shown in FIG. 11A, on the surface of a silicon substrate 1, a silicon oxide film 2 is formed having a thickness of, for example, 10 nm by thermal oxidation. On this silicon oxide film 2, a silicon nitride film 3 is formed having a thickness of, for example, 100 to 150 nm by chemical vapor deposition (CVD). The silicon oxide film 2 functions as a buffer layer for relaxing stress between the silicon substrate 1 and silicon nitride film 3. The silicon nitride film 3 functions as a stopper layer during a later polishing process.

On the silicon nitride film 3, a resist pattern 4 is formed. An opening defined by the resist pattern 4 defines an isolation region. The silicon substrate region under the resist pattern 4 defines the active region where electronic elements are to be formed.

By using the resist pattern 4 as an etching mask, the silicon nitride film 3, underlying silicon oxide film 2 and underlying silicon substrate 1 respectively exposed in the opening are etched by reactive etching (RIE) to a depth of, for example, about 0.5 µm to form a trench 6.

As shown in FIG. 11B, the silicon substrate surface exposed in the trench 6 is thermally oxidized to form a thermally oxidized silicon film 7 having a thickness of 10 nm for example.

As shown in FIG. 11C, a silicon oxide film 9 is deposited on the silicon substrate, for example, by high density plasma (HDP) CVD, the silicon oxide film 9 being buried or embedded in the trench. In order to make dense the silicon oxide film 9 which is used as the isolation region, the silicon substrate is annealed, for example, at 900 to 1100° C. in a nitrogen atmosphere.

As shown in FIG. 11D, the silicon oxide film 9 is polished downward by chemical mechanical polishing (CMP) or reactive ion etching (RIE) by using the silicon nitride film 3 as a stopper. The silicon oxide film 9 is therefore left only in the trench defined by the silicon nitride film 3. At this stage, annealing may be performed to make dense the silicon oxide film.

As shown in FIG. 11E, the silicon nitride film 3 is removed by using hot phosphoric acid. Next, the buffer silicon oxide film 2 on the surface of the silicon substrate 1 is removed by using dilute hydrofluoric acid. At this time, the silicon oxide film 9 buried in the trench is also etched to some degree.

As shown in FIG. 11F, the surface of the silicon substrate 1 is thermally oxidized to form a sacrificial silicon oxide film 22. Impurity ions of a desired conductivity type are implanted into the surface layer of the silicon substrate 1 via the sacrificial silicon oxide film, and activated to form a well 10 of the desired conductivity type in the surface layer of the silicon substrate 1. Thereafter, the sacrificial silicon oxide film 22 is removed by using dilute hydrofluoric acid. When the sacrificial silicon oxide film is removed, the silicon oxide film 9 is also etched to some degree by dilute hydrofluoric acid.

As shown in FIG. 11G, the exposed surface of the silicon substrate is thermally oxidized to form a silicon oxide film 11 having a desired thickness which is used as a gate insulating film. A polysilicon film 12 is deposited on the silicon substrate 1, and patterned to form a gate electrode. Impurity ions having an opposite conductivity type relative to that of the well 10 are implanted and activated to form source/drain regions. If necessary, side wall spacers are formed on the side walls of the gate electrode, and impurity ions of the opposite conductivity type are again implanted and activated to form high impurity concentration source/drain regions.

As the silicon oxide film 9 is buried in the trench and a heat treatment is performed for making it dense, the silicon oxide film 9 contracts as it becomes dense. The active region surrounded by the silicon oxide film 9 receives a compressive stress.

As the compressive stress is applied, the electron mobility in the active region of the silicon substrate may lower considerably. If the carrier mobility lowers, a saturated drain current reduces. As the active region becomes small as the semiconductor device is made miniaturized, the influence of compressive stress becomes large.

As the shoulder of the isolation region 9 is etched and a divot is formed as shown in FIG. 11G, not only the upper surface but also the side wall of the shoulder of the active region of the silicon substrate is surrounded by the gate electrode. As a voltage is applied to the gate electrode of such a shape, an electric field is concentrated upon the shoulder of the active region so that the shoulder forms a transistor having a lower threshold voltage. This parasitic transistor generates a hump on the IV characteristic curve.

A method of suppressing the formation of a divot and preventing the hump characteristics has been proposed (refer to Japanese Patent Laid-open Publication No. HEI-11-297812). According to this method, a silicon oxide film and a silicon nitride film are formed in this order on the inner surface of a trench, mask material is once filled in the trench, the mask material is then etched to such an extent that the surface level of the mask material in the trench becomes lower than the surface level of the semiconductor substrate, and the silicon nitride film exposed in the upper part of the trench above the mask material is removed.

A problem specific to STI may occur although STI is suitable for miniaturized fabrication. New techniques capable of overcoming the problem specific to STI has been desired.

SUMMARY OF THE INVENTION

An object of this invention is to provide a method of manufacturing a semiconductor device having STI capable of realizing good transistor characteristics.

Another object of the invention is to provide a semiconductor device having good transistor characteristics.

According to one aspect of the present invention, there is provided a method of manufacturing a semiconductor device, comprising the steps of: (a) forming a pattern on a surface of a semiconductor substrate, said pattern including a first silicon nitride film and having a window used for forming an isolation trench; (b) etching said semiconductor substrate by using said pattern as a mask, to form the isolation trench; (c) depositing a second silicon nitride film covering an inner surface of said isolation trench; (d) forming a first silicon oxide film covering said second silicon nitride film and burying said isolation trench; (f) etching said first silicon oxide film to remove said first silicon oxide film in an upper region of said isolation trench; (g) etching and removing exposed part of said second silicon nitride film; (h) forming a second silicon oxide film burying said isolation trench; (i) chemical-mechanical-polishing said second silicon oxide film by using said first silicon nitride film as a stopper; and (j) etching and removing said first silicon nitride film exposed.

According to another aspect of the present invention, there is provided a semiconductor device comprising: a semiconductor substrate; an isolation trench formed under a surface of said semiconductor substrate; a liner of a silicon nitride film covering a lower inner surface of said isolation trench retracted below the surface of said semiconductor substrate; a first silicon oxide film formed in a region surrounded by said liner of the silicon nitride film and burying a lower region of said isolation trench; a second silicon oxide film formed on said first silicon oxide film and burying an upper region of said isolation trench; and active regions defined by said isolation trench.

According to another aspect of the present invention, there is provided a semiconductor device comprising: a semiconductor substrate; an isolation trench formed under a surface of said semiconductor substrate; a liner of a silicon nitride film covering a lower inner surface of said isolation trench retracted below the surface of said semiconductor substrate; a silicon oxide film burying said isolation trench and having a void in a region surrounded by said liner of the silicon nitride film; and active regions defined by said isolation trench.

As above, the drain current can be increased by utilizing tensile stress of a silicon nitride film.

Formation of a parasitic transistor can be suppressed by preventing the formation of a divot on the shoulder of an active region.

DESCRIPTION OF THE PREFERRED EMBODIMENTS

The inventor has been in charge of studying a method of cancelling out compressive stress in a silicon oxide film by generating tensile stress in a liner of a silicon nitride film formed in a trench. The inventor has investigated how a drain current changes by forming the liner of the silicon nitride film on the inner surface of the trench and thereafter removing the silicon nitride film existing down to a predetermined depth from the semiconductor substrate surface, and how a drain current changes with a thickness of the silicon nitride film.

Figure 1A:
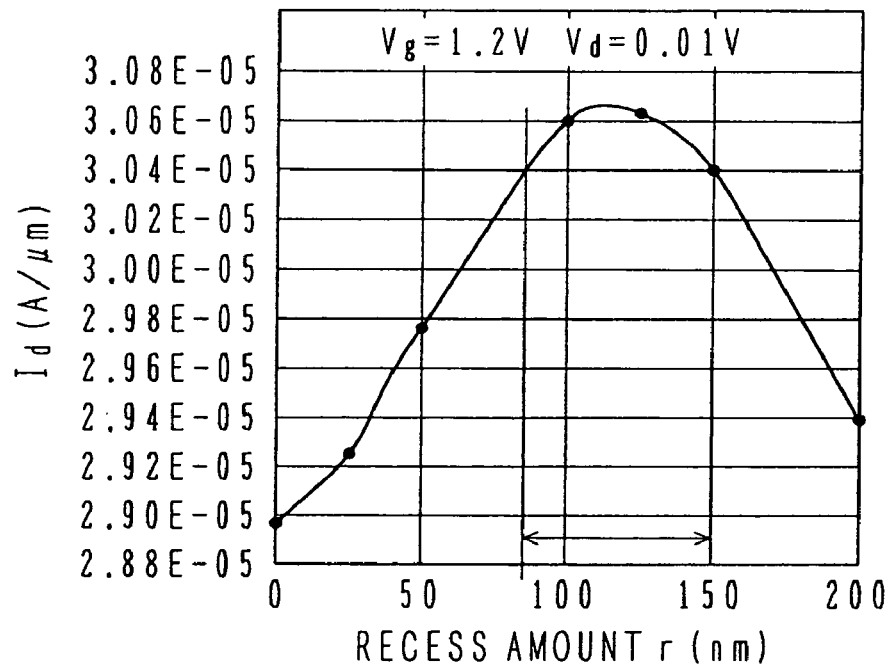
FIGS. 1A and 1B are graphs showing analysis results of simulation made by the inventor.

FIG. 1A is a graph showing simulation results of a change in a drain current Id relative to a recess amount r corresponding to a recess amount of the upper edge of a silicon nitride film from the surface of a substrate surface. The thickness of the silicon nitride film was set to 100 nm, a gate voltage Vg was set to 1.2 V and a drain voltage Vd was set to 0.01 V.

As seen from FIG. 1A, as the recess amount r is increased starting from 0, the drain current Id increases. As the recess amount r increases, an increase in the drain current Id saturates and thereafter the drain current Id reduces. The drain current Id relative to a change in the recess amount r has therefore a peak. The drain current Id becomes largest at the recess amount r of 80 to 150 nm.

Figure 1B:
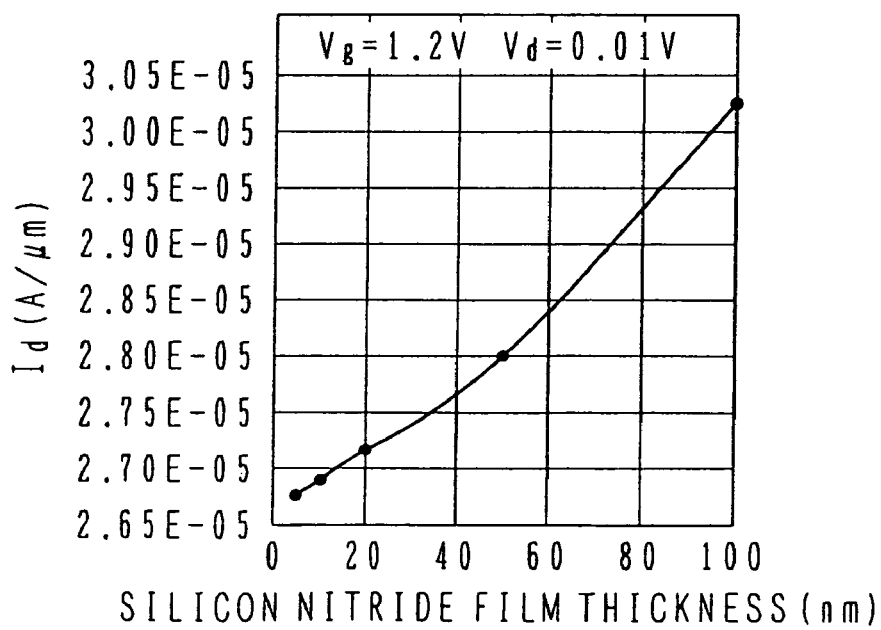

FIG. 1B is a graph showing simulation results of a change in a drain current Id relative to a change in a silicon nitride film thickness. The recess amount was set to 80 nm, the gate voltage Vg was set to 1.2 V and the drain voltage Vd was set to 0.01 V. As seen from FIG. 1B, as the thickness of the silicon nitride film increases, the drain current Id increases. It is possible to confirm the effects that the thicker the liner of the silicon nitride film is, the drain current is increased more. It can be considered that the thickness of the liner of the silicon nitride film is preferably 20 to 40 nm if the trench width is 100 nm or narrower.

In accordance with these simulation results, a liner of a silicon nitride film was formed on the inner surface of a trench, and the silicon nitride film liner in the upper region of the trench was removed to increase the drain current. This embodiment will be described in the following.

FIGS. 2A to 2J are cross sectional views schematically illustrating a process of forming an STI isolation region according to a first embodiment of the invention.

Figure 2A:
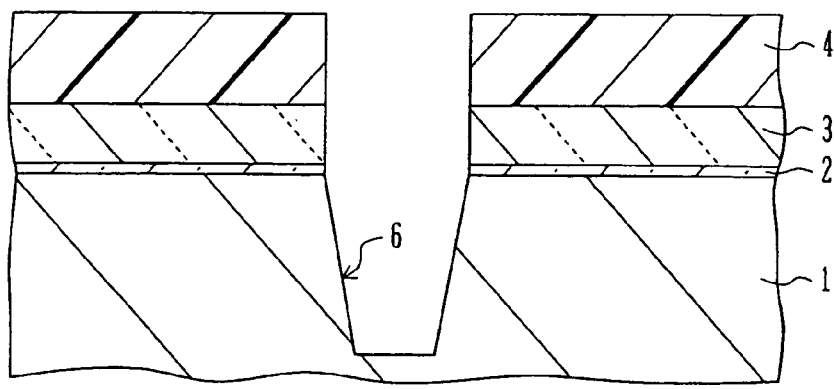
FIGS. 2A to 2J are cross sectional views illustrating an STI forming method according to a first embodiment.

As shown in FIG. 2A, on the surface of a silicon substrate 1, a silicon oxide film 2 is formed by thermal oxidation to a thickness of 3 to 21 nm, e.g., 10 nm. On the silicon oxide film 2, a silicon nitride film 3 is formed by low pressure (LP) chemical vapor deposition (CVD) to a thickness of 100 to 150 nm, e.g., 100 nm. For example, LPCVD is performed at a temperature of 700° C. by using $SiCl_2H_2$ and $NH_3$ as source gas.

On the silicon nitride film 3, a resist film is coated, exposed and developed to form a resist pattern 4. The resist pattern 4 is formed on the active regions (electronic elements forming regions) and an opening of the resist pattern defines the isolation region. The width of the opening is in the range of 0.1 to 5 μm, e.g., 0.1 μm.

By using the resist pattern 4 as an etching mask, the silicon nitride film 3, silicon oxide film 2 and silicon substrate 1 are etched. The silicon substrate is etched to a depth of, for example, 0.3 μm to form a trench 6. The silicon nitride film and silicon oxide film are etched by using mixed gas of $CF_4$, $CHF_3$ and Ar as etching gas. The silicon substrate 1 is etched by using mixed gas of HBr and $O_2$ or mixed gas of $Cl_2$ and $O_2$.

Under these etching conditions, the trench 6 has slanted side walls. The slanted side walls can relax the electric field concentration upon the shoulder of the active region. The resist pattern 4 is thereafter removed.

Figure 2B:
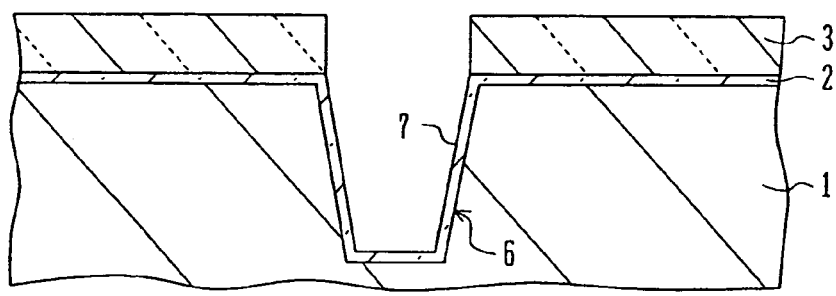

As shown in FIG. 2B, the silicon substrate surface exposed on the surface of the trench 6 is thermally oxidized to form a silicon oxide film 7 having a thickness of 1 to 20 nm, e.g., 10 nm. The whole silicon surface exposed in the trench 6 is therefore covered with the silicon oxide film 7.

Figure 2C:
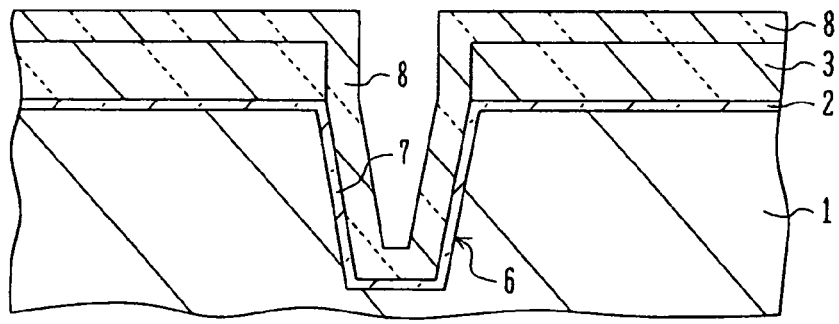

As shown in FIG. 2C, a silicon nitride film 8 is formed by LPCVD, covering the surfaces of the silicon oxide film 7 and silicon nitride film 3. The thickness of the silicon nitride film 8 is in the range of 20 to 40 nm, e.g., 20 nm. The thicker the silicon nitride film, a larger tensile stress is generated. The maximum thickness of the silicon nitride film is determined from the trench width.

LPCVD is performed at a temperature of about 650° C. by using mixed gas of $SiCl_2H_2$ and $NH_3$ as source gas. A silicon nitride film formed by such thermal CVD has a tensile stress of 1 GPa or larger. This stress has a direction opposite to that of a stress of a buried silicon oxide film subjected to a heat treatment process of making the film dense to be later described.

The silicon nitride film can also be formed by thermal CVD using bis-tertial butylaminosilane (BTBAS) and ammonia ($NH_3$) as source gas.

This thermal CVD is carried out under the conditions of, pressure 1.33 Pa–1330 Pa, for example 65 Pa, substrate temperature 550–580, flow rate of BTBAS 5 sccm–200 sccm, for example 40 sccm, flow rate of $NH_3$ 50 sccm–200 sccm for example 160 sccm, flow rate ratio [BTBAS]:[$NH_3$] =1:1–2:20, for example 1:4.

The substrate temperature of 550–580 is lower than the substrate temperature of 650 in LPCVD using $SiCl_2H_2$ and $NH_3$ as source gas. The resultant silicon nitride contains carbon.

Figure 2D:
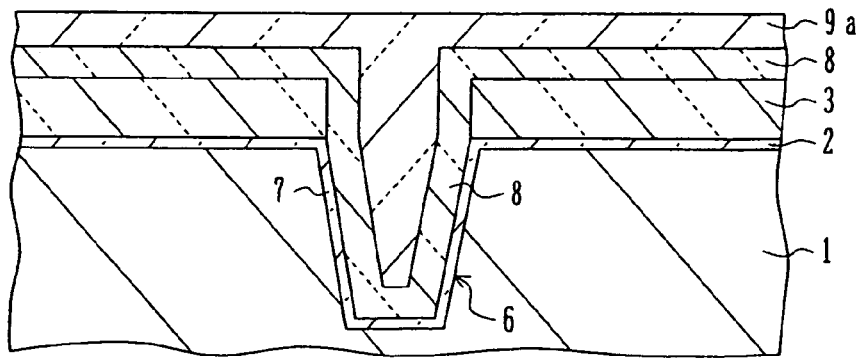

As shown in FIG. 2D, on the substrate formed with the silicon nitride film 8, a silicon oxide film 9a is formed to bury it in the trench, by high density plasma (HDP) CVD using, for example, an inductive coupling plasma CVD system. The HDP silicon oxide film is formed by using as source gas mixed gas of $SiH_4$ and oxygen or mixed gas of tetraethoxysilane (TEOS) and ozone. The thickness of the silicon oxide film 9a is selected so that the trench is completely buried. Instead of forming the silicon oxide film by CVD, a silicon oxide film of a spin-on-glass (SOG) coating type may be used.

Figure 2E:
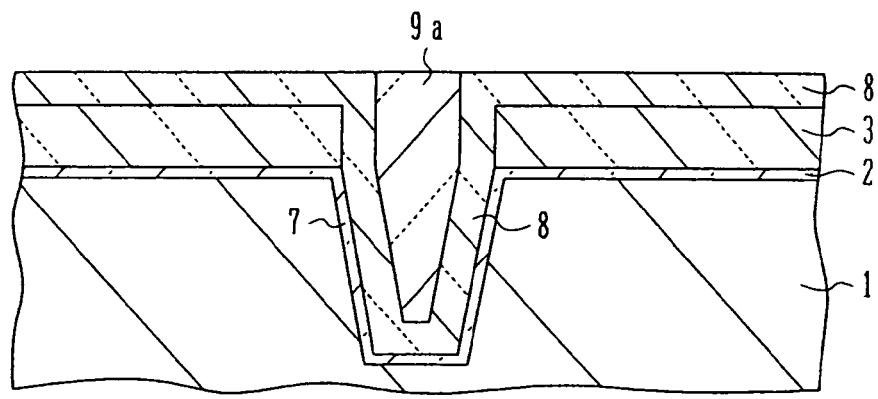

As shown in FIG. 2E, the silicon oxide film 9a on the silicon nitride film 8 is first partially removed by chemical mechanical polishing (CMP) to leave a flat silicon oxide film 9a having a thickness of 20 to 100 nm. In succession, CMP is performed, for example, down to the surface of the silicon nitride film 8 by using the silicon nitride film 8 as a CMP stopper.

CMP is performed by squeezing the silicon substrate between rotating upper and lower surface plates. For example, the rotating speed of the upper and lower surface plates is set to 20 rpm, a pressure between the upper and lower surface plates is set to 5 psi, a back pressure is set to 5 psi, and slurry having as its main composition colloidal silica or slurry which contains cerium oxide is used as polishing agent. Under such polishing conditions, an etching rate of the silicon nitride layer 3 is small so that the silicon nitride layer 3 functions as a stopper of polishing.

After the silicon oxide layer 9 is grown or subjected to CMP, annealing is performed, for example, for 30 minutes at about 1000° C. to make different densities in the silicon oxide film 9 uniform. The silicon oxide film 9a becomes homogeneous and its etching characteristics become uniform.

Figure 2F:
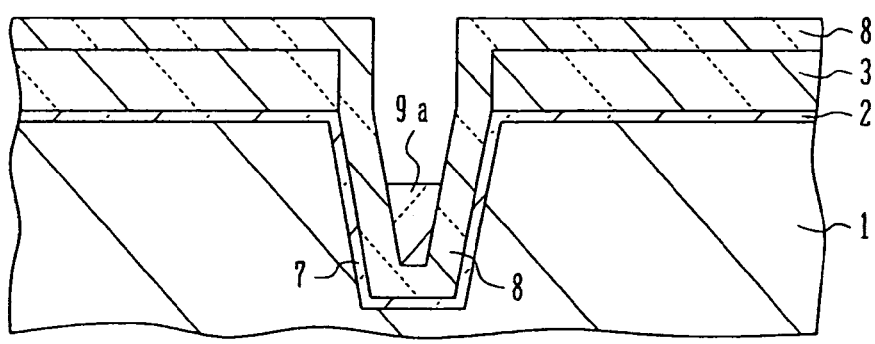

As shown in FIG. 2F, etching for 2000 seconds using dilute hydrofluoric acid is performed to remove the silicon oxide film 9a in the upper region of the trench. With this liquid phase etching, the surface of the silicon oxide film 9a sinks while the flatness of the upper surface is maintained. Instead of the liquid phase etching, chemical dry etching (CDE) using CF containing gas may be used.

The CMP process is not essential. For example, a silicon oxide film having a planarizing function may be formed and etched without using the CMP process. Alternatively, the silicon oxide film 9a on the silicon nitride film 8 may be etched by reactive ion etching (RIE) and thereafter the silicon film 9a in the trench is etched by CDE. Although a variation in recess amounts increases to some degree, the process can be simplified and the manufacture cost can be reduced.

In the region where the silicon oxide film 9a is removed by the processes shown in FIGS. 2E and 2F, the silicon nitride film 8 is exposed.

Figure 2G:
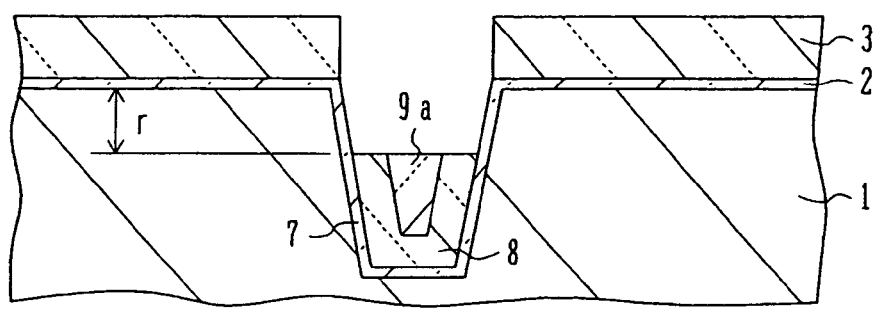

As shown in FIG. 2G, the exposed silicon nitride film 8 is etched by boiling phosphoric acid ($H_3PO_4$). The liner silicon nitride film 8 having a thickness of 20 nm is completely etched and the masking silicon nitride film 3 is hardly etched as yet. A recess amount r of the removed silicon nitride from the surface of the silicon substrate 1 is controlled mainly by the etching depth of the silicon oxide film 9a. If the trench has a depth of 300 nm, the silicon nitride film 8 is etched, for example, by a depth of 110 nm from the surface of the silicon substrate 1.

By lowering the liner silicon nitride film 8 by 80 to 150 nm from the silicon substrate surface, an increase in the drain current of a MOS transistor can be expected.

Figure 2H:
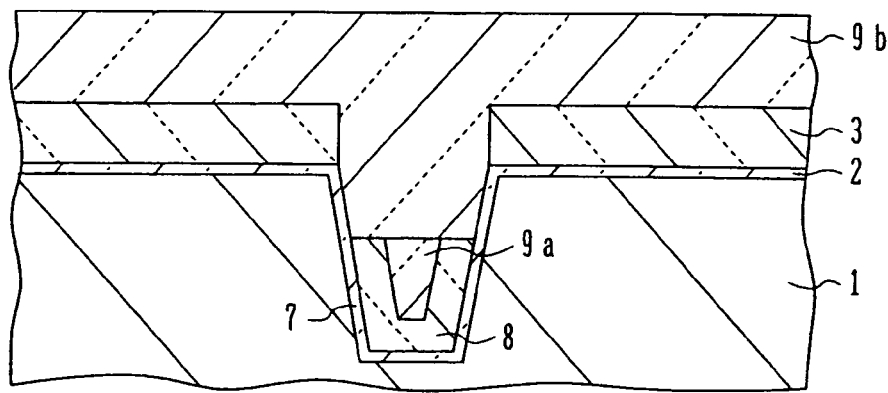

As shown in FIG. 2H, a silicon oxide film 9b is deposited by HDPCVD similar to that described above to a thickness of, for example, 300 nm to bury the trench. The silicon oxide film 9b is deposited also on the surface of the silicon nitride film 3.

Figure 2I:
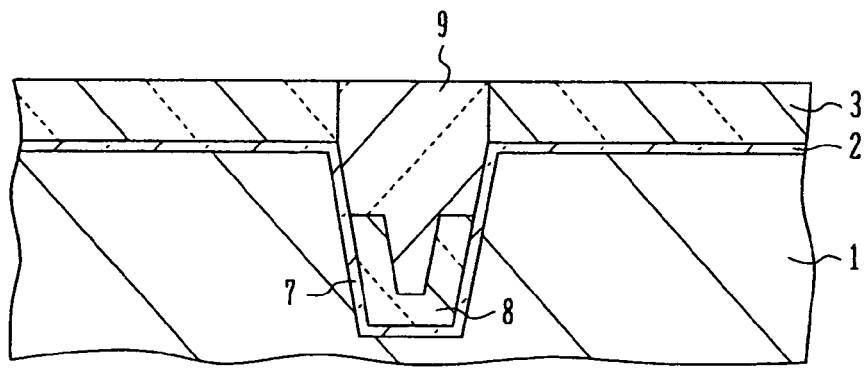

As shown in FIG. 2I, the silicon oxide film 9b on the silicon nitride film 3 is removed by CMP similar to that described earlier. The silicon nitride film 3 functions as a CMP stopper. Although the silicon oxide film 9 on the silicon nitride film 3 is removed by CMP, it may be removed by RIE using mixed gas of $CH_4$ and $CHF_3$.

After the unnecessary silicon oxide film is removed, the silicon oxide film 9b is made dense by annealing, for example, for 30 minutes at 1000° C. The silicon oxide film 9a already annealed is made denser. Annealing may be performed before CMP.

The quality of the annealed silicon oxide film 9 in the trench is almost the same as that of a thermally oxidized film. Although the dense silicon oxide film generates compressive stress, the direction of this compressive stress is opposite to the direction of tensile stress of the silicon nitride film, so that the compressive stress is cancelled out by the tensile stress. The mobility can be prevented from being lowered by the compressive stress.

Figure 2J:
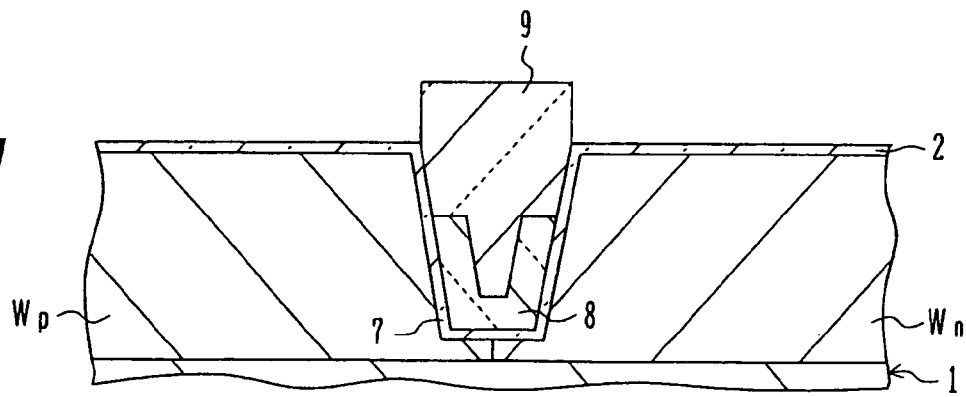

As shown in FIG. 2J, the masking silicon nitride film 3 is removed by boiling phosphoric acid ($H_3PO_4$). In this case, the liner silicon nitride film 8 will not be etched because it is lowered from the surface of the silicon substrate 1 and covered with the silicon oxide film 9. It is therefore possible to prevent the formation of a divot to be formed if the liner silicon nitride film is etched. With the processes described above, an STI isolation region is formed. Thereafter, an n-well Wn and a p-well Wp are formed through ion implantation by using resist masks. Ion implantation may be performed by removing the silicon oxide film 2 and forming a new sacrificial film. Semiconductor devices such as MOS transistors are formed thereafter by general processes.

Figure 3A:
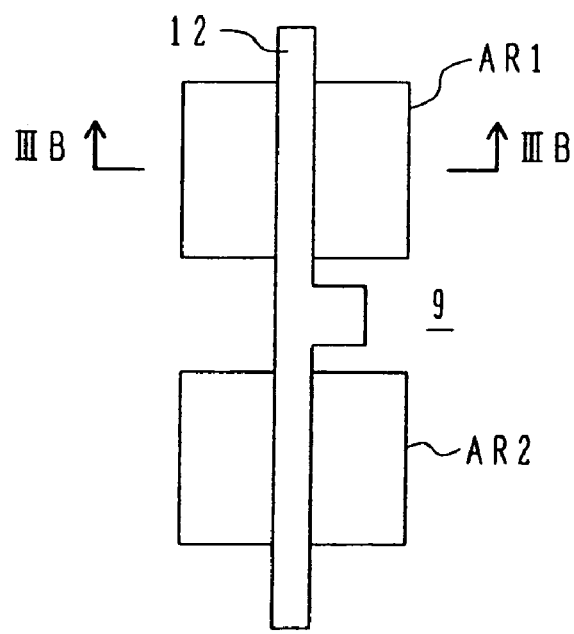
FIGS. 3A and 3B are a plan view and a cross sectional view showing the structure of a semiconductor device formed in an active region.
Figure 3B:
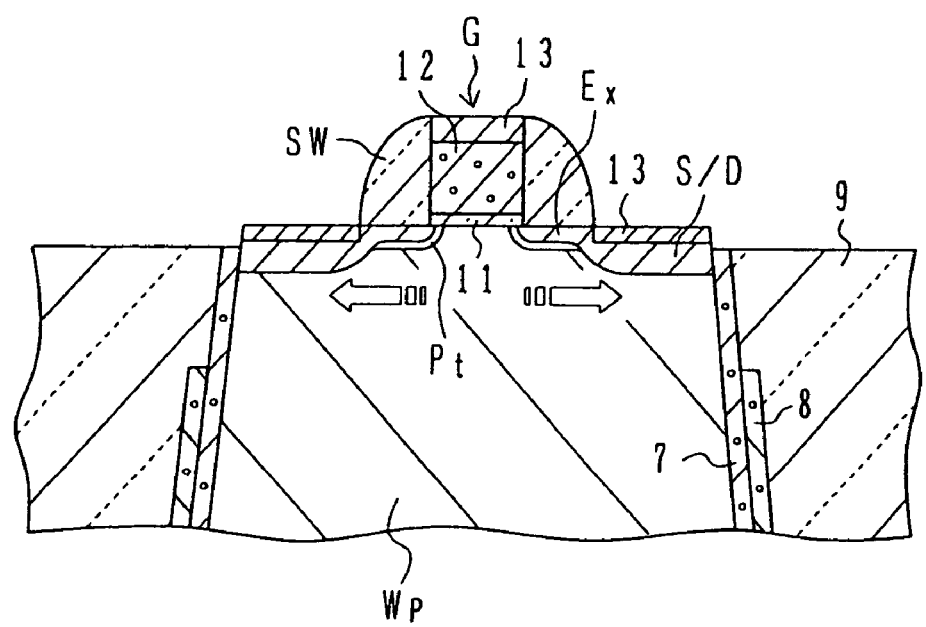

FIG. 3A is a plan view showing the shapes of active regions AR1 and AR2 defined by an isolation region 9 and a gate electrode 12 formed on the surface of a silicon substrate. The gate electrode shown has the shape before side wall spacers are formed. FIG. 3B is a cross sectional view taken along line IIIB-IIIB shown in FIG. 3A. Each active region AR is surrounded by the isolation region 9. The two active regions AR1 and AR2 are used to form a CMOS inverter. Although the CMOS inverter has an n-channel MOS transistor and a p-channel MOS transistor, description will be given on the n-channel MOS transistor by way of example.

As shown in FIG. 3B, on each active region, a gate insulating film 11 having a thickness of, for example, 2 nm is formed by thermal oxidation. On the gate insulating film 11, a polysilicon layer 12 having a thickness of, for example, 100 nm is formed by chemical vapor deposition (CVD). On the polysilicon layer, a photoresist mask is formed. The polysilicon layer 12 is patterned by reactive ion etching (RIE) to form a gate electrode G having a gate length of 80 nm for example.

The p-channel region is covered with a resist mask, and n-type impurity ions, which conductivity type is opposite to that of the p-type well, are implanted to form shallow n-type extension regions Ex having a low impurity concentration. If necessary, p-type impurity ions, which have the same conductivity type as that of the p-type well, are implanted along four directions each inclined by 28° from the substrate normal to form p-type pocket regions Pt. For the p-channel regions, the processes with the inverted conductivity type are performed.

On the substrate, a silicon oxide film or a lamination film of a silicon oxide film and a silicon nitride film is deposited and anisotropically etched by RIE to form side wall spacers SW. The p-type region is covered with a resist mask, and n-type impurity ions, which have the opposite conductivity type to that of the p-well, are implanted at a high impurity concentration to form n-type source/drain regions S/D having a high impurity concentration. For the p-channel regions, the processes with the inverted conductivity type are performed.

A metal layer of cobalt or titanium is deposited, and a silicidation process is performed, for example, in two steps to form silicide layers 13. With these processes, MOS transistors are formed. Another known method may be employed for forming MOS transistors.

In the first embodiment, the silicon nitride film liner 8 is buried in the silicon oxide film to prevent the formation of a divot when the stopper silicon nitride film 3 is etched. However, when the silicon oxide film 2 is removed, the STI-burying silicon oxide film 9 will etched inevitably so that a divot may be formed.

FIGS. 4A to 4D illustrate a second embodiment capable of preventing the formation of a divot when the silicon oxide film is etched.

First, the processes of the first embodiment shown in FIGS. 2A to 2G are performed.

Figure 4A:
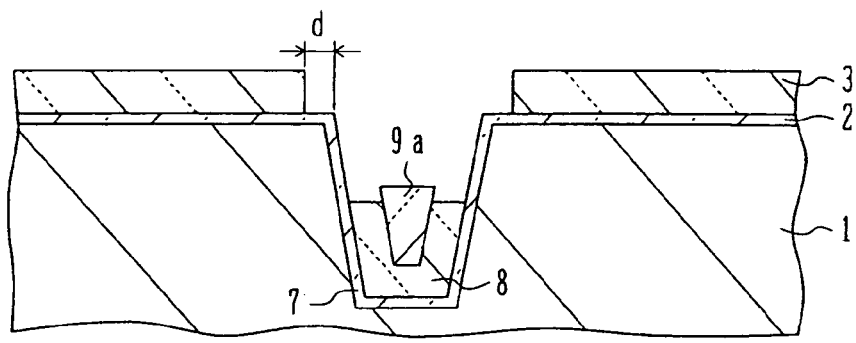
FIGS. 4A to 4D are cross sectional views illustrating an STI forming method according to a second embodiment.

As shown in FIG. 4A, in etching the liner of the silicon nitride film 8 having a thickness of 20 nm for example, over-etching of a thickness of 10 nm is performed (the total etching amount corresponds to a thickness of 30 nm). This over-etching etches the silicon nitride film 8 lower than the surface of the left silicon oxide film 9a, and also etches the upper surface and side walls of the stopper silicon nitride film 3 on the silicon oxide film 2. Namely, the side walls of the silicon nitride film 3 retract, for example, by 10 nm from the shoulders of the active regions 1.

Figure 4B:
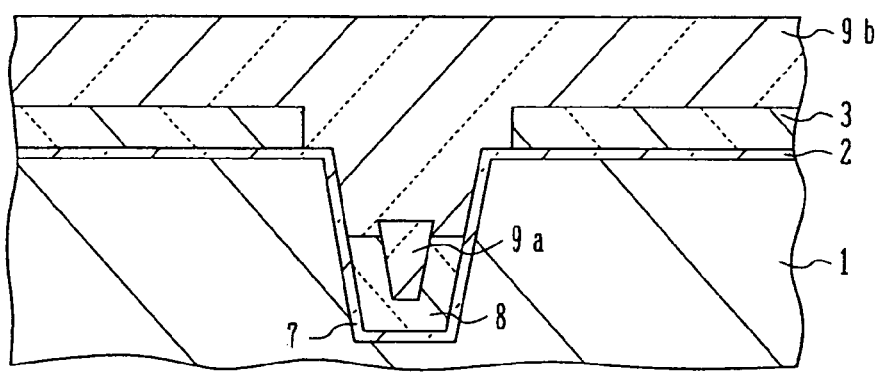

As shown in FIG. 4B, the second silicon oxide film 9b is deposited in the manner similar to the first embodiment.

Figure 4C:
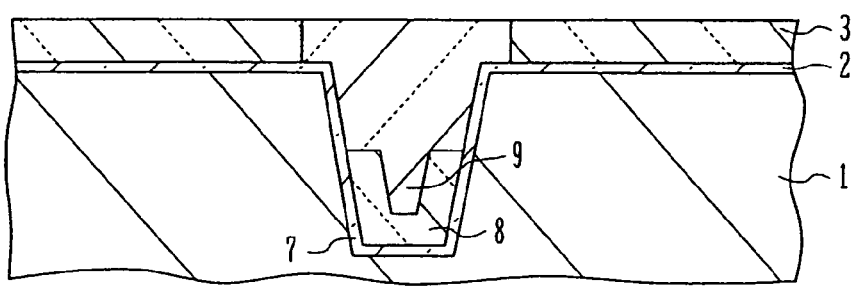

As shown in FIG. 4C, the second silicon oxide film 9b is subjected to CMP to remove the silicon oxide film 9b on the silicon nitride film 3. It is preferable to set the initial thickness of the silicon nitride film 3 so that it can provide the CMP stopper function.

Figure 4D:
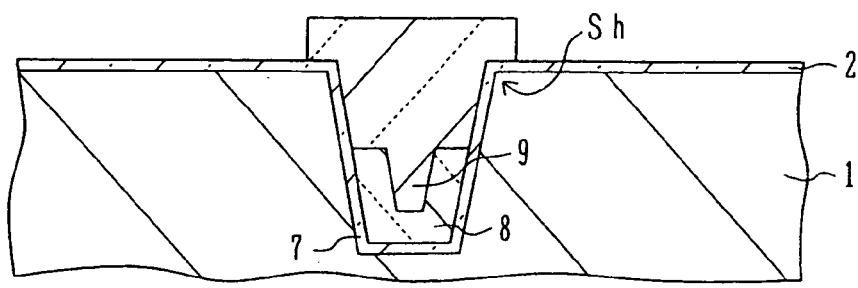

As shown in FIG. 4D, the silicon nitride film 3 is removed by boiling phosphoric acid. The shoulder Sh of the active region is covered with the burying silicon oxide film 9. Even if the silicon oxide film 2 is removed by dilute hydrofluoric acid, it is possible to prevent a divot from being formed on the outer surface of the shoulder Sh of the active region, although the silicon oxide film 9 is etched to some degree.

It can be said from another viewpoint that the amount of over-etching shown in FIG. 4A is preferably set larger than the total etching amount of the later etching processes using dilute phosphoric acid. For example, if there are two etching processes, each etching silicon oxide by a thickness of 2 nm, the side walls are preferably retracted by 6 nm to 12 nm, taking the over-etching amount into consideration.

FIGS. 5A to 5J illustrate a method of forming an STI according to a third embodiment.

Figure 5A:
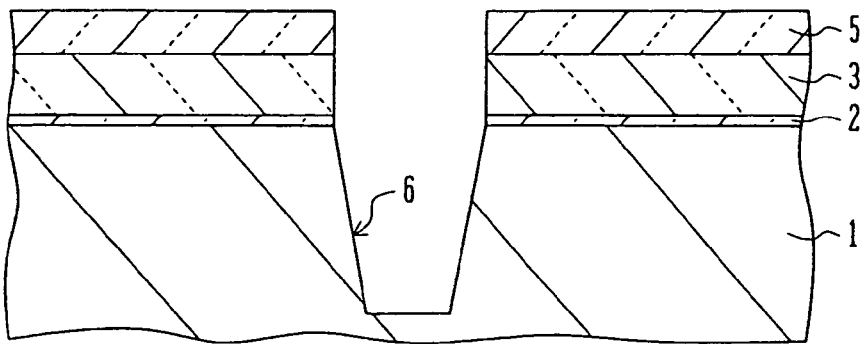
FIGS. 5A to 5J are cross sectional views illustrating an STI forming method according to a third embodiment.

As shown in FIG. 5A, the surface of a silicon substrate 1 is thermally oxidized to form a silicon oxide film 2, and a silicon nitride film 3 is formed on the silicon oxide film 2. These processes are similar to those of the first embodiment. On the silicon nitride film 3, a silicon oxide film 5 is formed by LPCVD to a thickness of about 50 nm for example. A resist pattern is formed on the silicon oxide film 5. The silicon oxide film 5, silicon nitride film 3 and silicon oxide film 2 are etched and then the silicon substrate 1 is etched by a depth of, for example, 300 nm to form a trench 6.

Figure 5B:
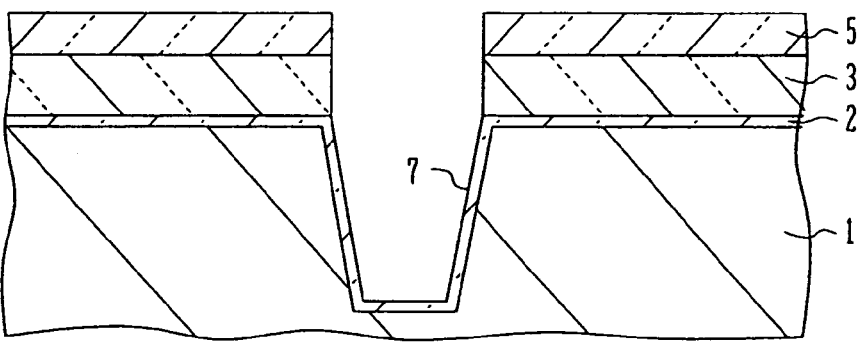

As shown in FIG. 5B, the surface of the silicon substrate exposed in the trench 6 is thermally oxidized to form a silicon oxide film 7 having a thickness of 5 nm for example.

Figure 5C:
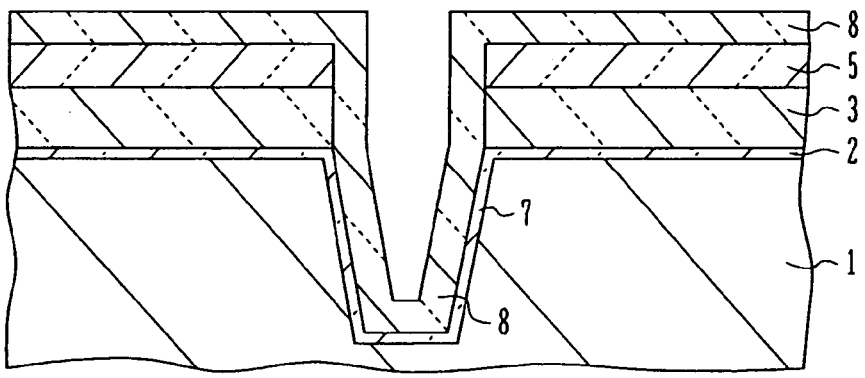

As shown in FIG. 5C, a liner silicon nitride film 8 is formed, for example, by LPCVD to a thickness of about 20 nm so as to cover the inner surface of the trench.

Figure 5D:
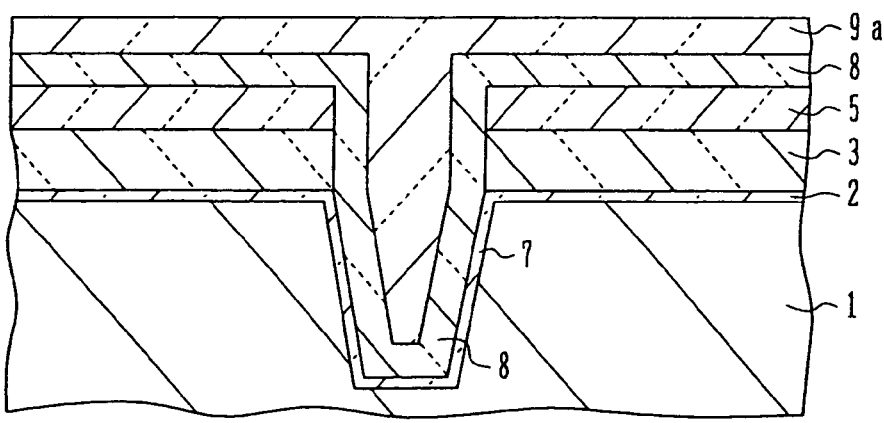

As shown in FIG. 5D, a silicon oxide film 9a is formed by HDPCVD, burying or embedding the trench.

Figure 5E:
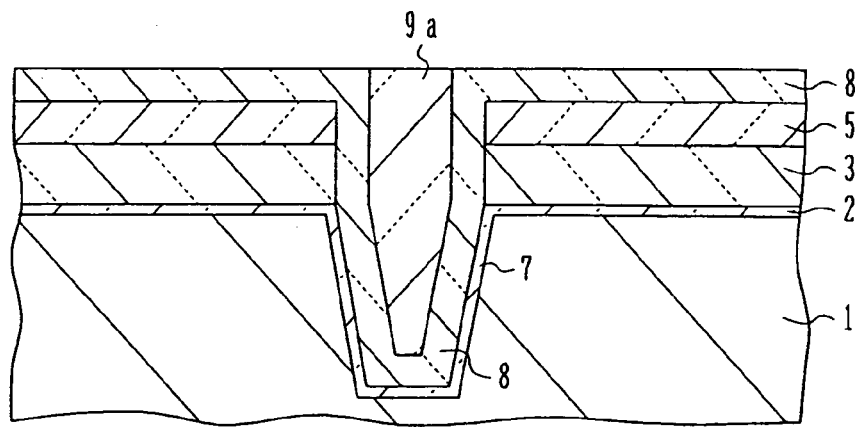

As shown in FIG. 5E, the silicon oxide film 9a on the silicon nitride film 8 is polished by CMP to form a flat surface and CMP is stopped at a position higher than the silicon oxide film 5 by 20 to 100 nm. For example, the surface of the silicon nitride film 8 is exposed.

Figure 5F:
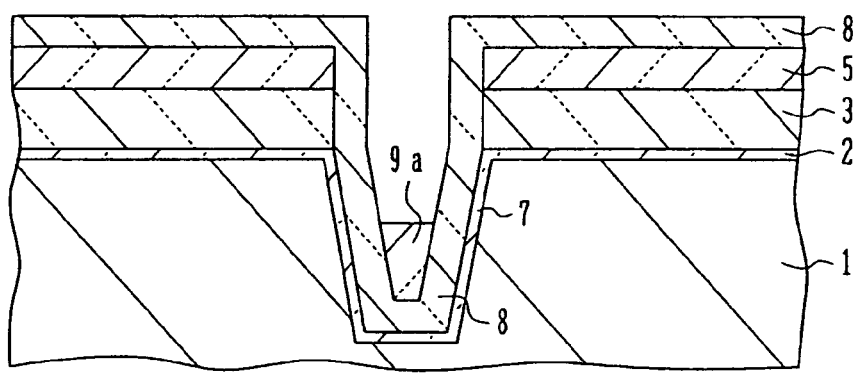

As shown in FIG. 5F, the silicon oxide film 9a is etched by dilute hydrofluoric acid to lower its upper surface to the level of, for example, 110 nm below from the surface of the silicon substrate 1.

Figure 5G:
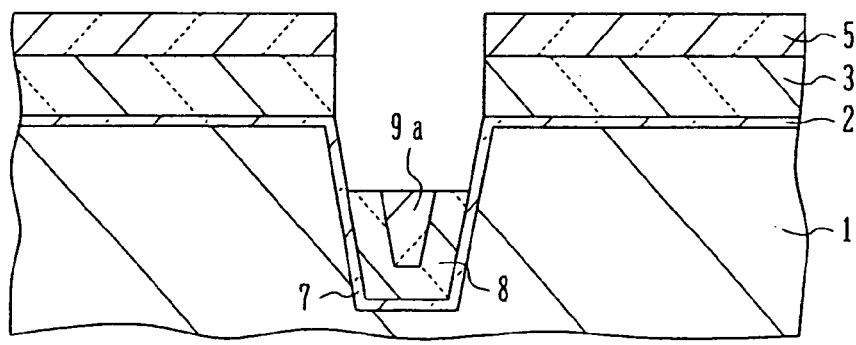

As shown in FIG. 5G, the exposed liner silicon nitride film 8 is etched by hot phosphoric acid. The silicon nitride film 8 is left only in the lower region of the trench. The recess amount of the silicon nitride film 8 from the surface of the silicon substrate 1 is controlled by the etching amount of the silicon oxide film 9a.

Figure 5H:
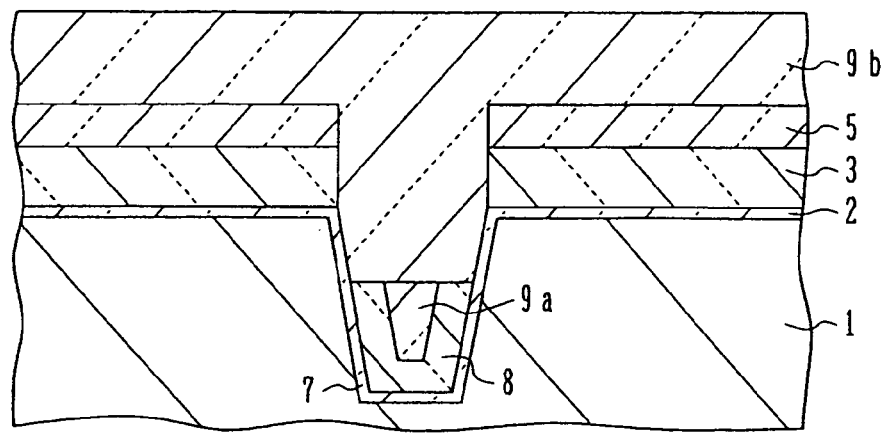

As shown in FIG. 5H, in the state that the silicon nitride film 8 is left only in the lower region of the trench, a silicon oxide film 9b is grown by HDPCVD to a thickness of 300 nm for example. The trench is therefore buried or embedded with the silicon oxide film 9b.

Figure 5I:
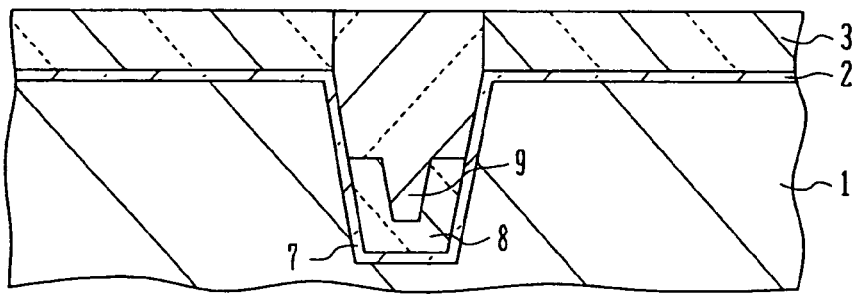

As shown in FIG. 5I, the silicon oxide films 9b and 5 are polished by CMP. During this CMP, the silicon nitride film 3 functions as a stopper. Thereafter, the silicon oxide film 9 is made dense by annealing, for example, for 30 minutes at 1000° C.

Figure 5J:
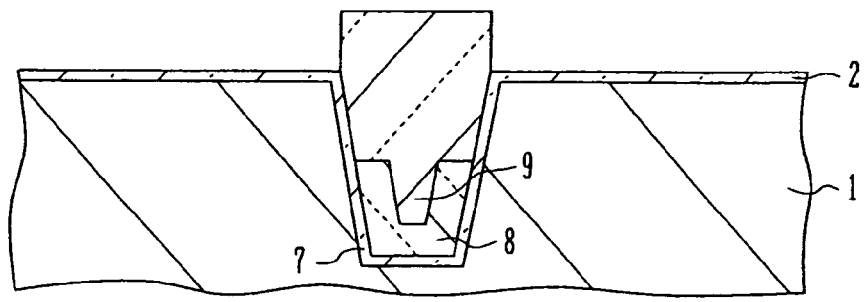

As shown in FIG. 5J, the stopper silicon nitride film 3 is removed by hot phosphoric acid. Since the whole surface of the substrate after the silicon nitride film 3 is removed is covered with the silicon oxide film, it is possible to prevent the formation of a divot otherwise to be formed if the liner silicon nitride film is etched.

In the third embodiment, although the formation of a divot can be prevented when the stopper silicon nitride film is etched, a divot can be formed if the burying silicon oxide film is etched when the silicon oxide film is etched.

FIGS. 6A to 6D illustrate a fourth embodiment capable of suppressing the formation of a divot when the silicon oxide film is etched, by retracting the silicon nitride film 3.

First, the processes shown in FIGS. 5A to 5G are performed in a manner similar to the third embodiment.

Figure 6A:
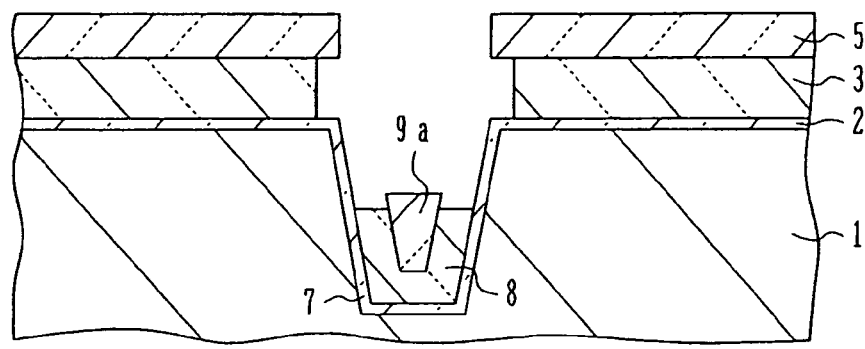
FIGS. 6A to 6D are cross sectional views illustrating an STI forming method according to a fourth embodiment.

As shown in FIG. 6A, etching continues to over-etch the silicon nitride film 8. For example, over-etching by a thickness of 30 nm is performed relative to the silicon nitride film 8 having a thickness of 20 nm. The side walls of the silicon nitride film 3 is therefore retracted by about 10 nm.

Figure 6B:
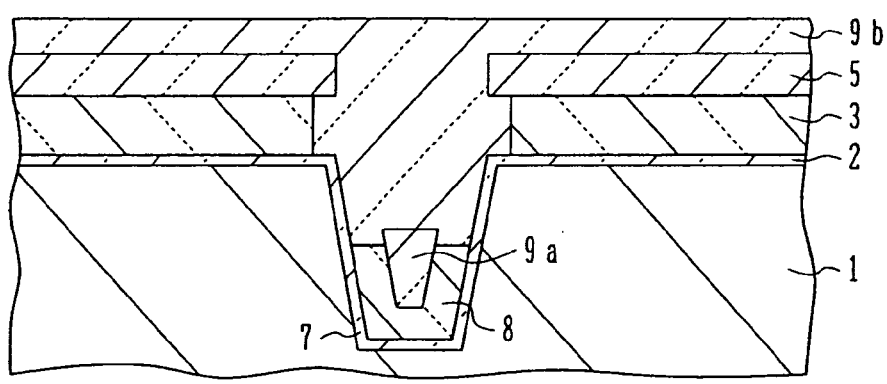

As shown in FIG. 6B, a silicon oxide film 9b is deposited by HDPCVD.

Figure 6C:
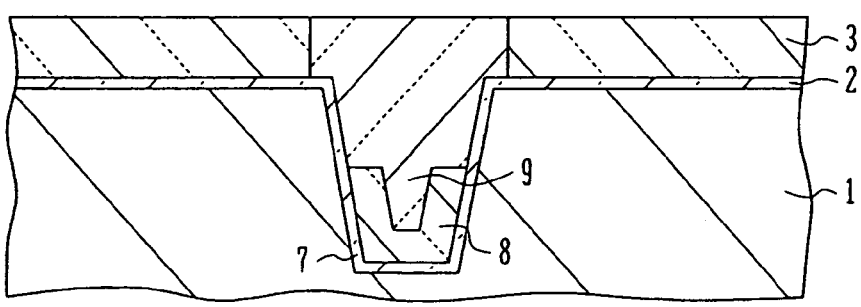

As show in FIG. 6C, the silicon oxide films 9b and 5 are removed by CMP. During this CMP, the silicon nitride film 3 functions as a stopper.

Figure 6D:
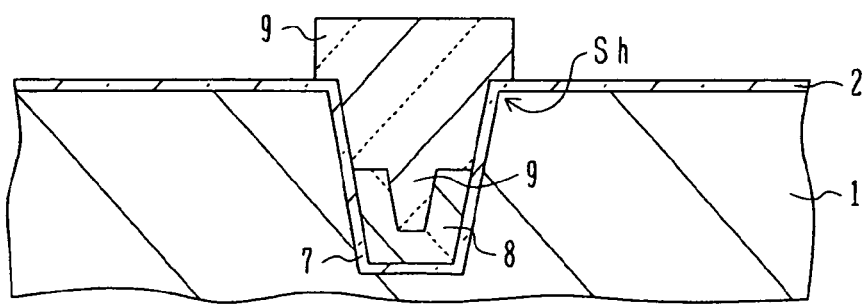

As shown in FIG. 6D, the silicon nitride film 3 is removed by hot phosphoric acid.

In the state shown in FIG. 6D, the burying silicon oxide film 9 covers the corner of the shoulder Sh of the active region by a width of about 10 nm because the side wall of the silicon nitride film 3 was retracted by the process shown in FIG. 6A. Therefore, in the later process of etching the silicon oxide film by dilute hydrofluoric acid, it is possible to prevent the formation of a divot otherwise to be formed when the burying silicon oxide film 9 is etched.

FIGS. 7A to 7D illustrate a method of forming an STI region according to a fifth embodiment.

First, the processes of FIGS. 2A to 2G are performed in a manner similar to the first embodiment.

Figure 7A:
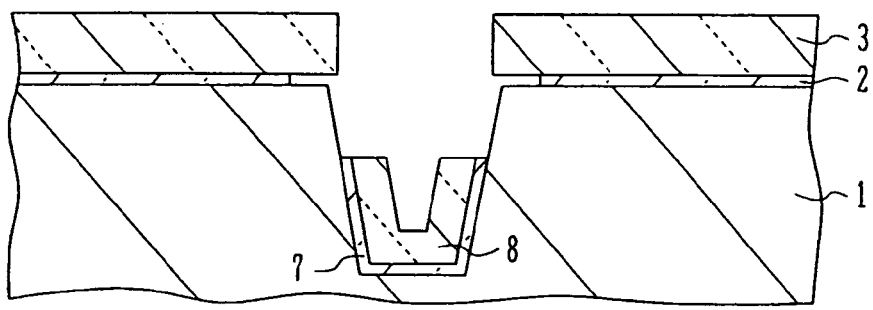
FIGS. 7A to 7D are cross sectional views illustrating an STI forming method according to a fifth embodiment.

As shown in FIG. 7A, after the upper region of the silicon nitride film 8 is etched, the silicon oxide film 9a surrounded by the silicon nitride film 8 is removed through etching by dilute hydrofluoric acid for about 2000 seconds. In this case, the side walls of the buffer silicon oxide film 2 formed under the stopper silicon nitride film 3 are side-etched.

Figure 7B:
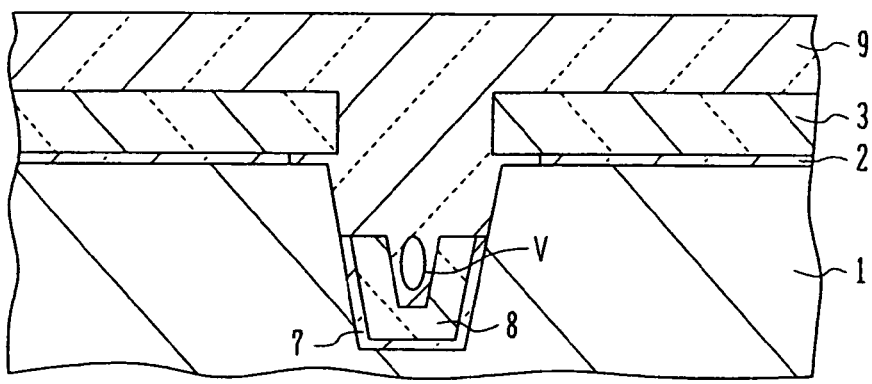

As shown in FIG. 7B, a silicon oxide film 9 is formed by HDPCVD to a thickness of 300 nm for example. In this film forming process, the burying characteristics are degraded by adjusting the film forming conditions so that a void V is formed in a narrow space surrounded by the silicon nitride film 8. As the width of the trench is narrowed, it becomes difficult to completely bury the whole inner space of the trench. In this embodiment, a difficulty in burying the trench is positively utilized. For example, the void V is formed at the depth of about 150 nm from the surface of the silicon substrate 1.

Figure 7C:
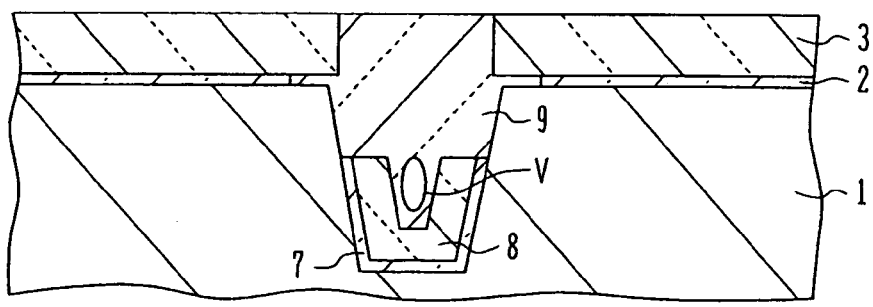

As shown in FIG. 7C, the silicon oxide film 9 on the silicon nitride film 3 is removed by CMP to form a flat surface. Annealing for about 30 minutes at 1000° C. is performed to make the silicon oxide film 9 dense. Even if the void V is formed in the lower region of the trench, the annealed silicon oxide film 9 becomes dense and provides a sufficient performance as the isolation region.

Figure 7D:
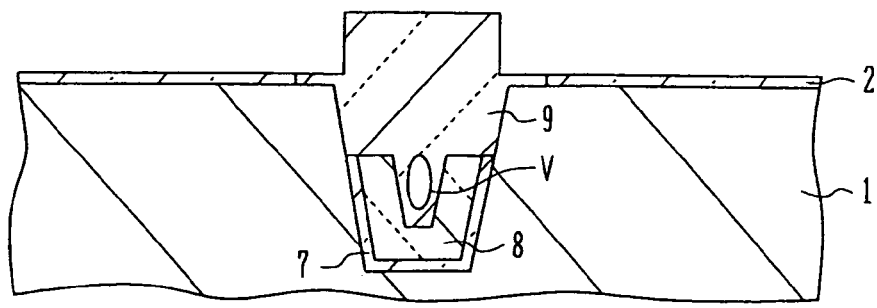

As shown in FIG. 7D, the silicon nitride film 3 is removed by hot phosphoric acid.

In this embodiment, the isolation region above the silicon nitride film 8 is made of the silicon oxide film 9 formed by one film forming process. The void V exists under the silicon oxide film 9. Existence of the void V reduces the compressive stress of the dense silicon oxide film 9. Reduction in the compressive stress increases the effects of the tensile stress of the silicon nitride film 8.

FIGS. 8A to 8D illustrate a method of forming an STI region according to a sixth embodiment.

Similar to the second embodiment, in the process of etching a silicon nitride film shown in FIG. 2G, over-etching like that shown in FIG. 4A is performed. With this over-etching, the silicon nitride film 3 on the surface of the active region is also etched so that the side walls thereof are retracted.

Thereafter, the process similar to that of the fifth embodiment is performed.

Figure 8A:
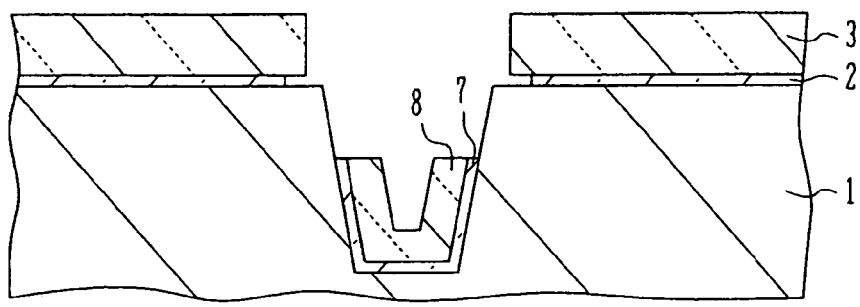
FIGS. 8A to 8D are cross sectional views illustrating an STI forming method according to a sixth embodiment.

As shown in FIG. 8A, the silicon oxide film 9a left in the region surrounded by the silicon nitride film 8 is removed by a dilute hydrofluoric acid process for about 2000 seconds. The silicon oxide film 2 under the silicon nitride film 3 is also side-etched.

Figure 8B:
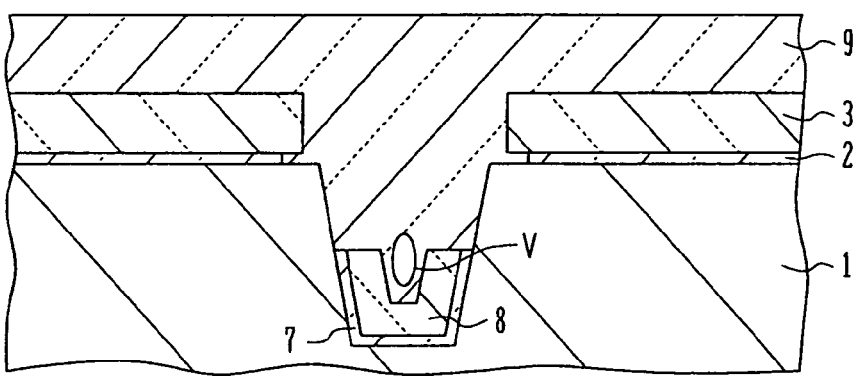

As shown in FIG. 8B, a silicon oxide film 9 is formed in the trench from which the silicon oxide film 9a has been removed. The trench is buried with the silicon oxide film 9 having a void V in the lower region of the trench surrounded by the silicon nitride film 8.

Figure 8C:
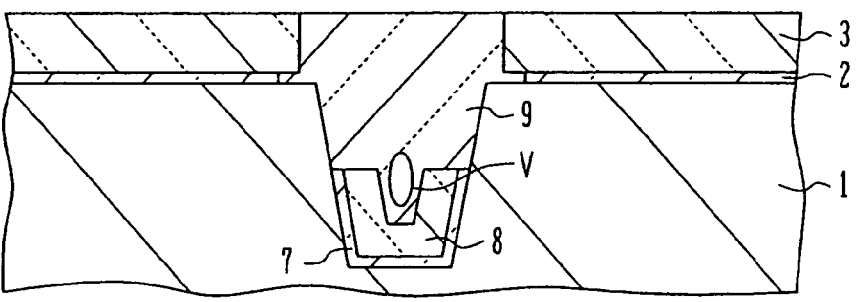

As shown in FIG. 8C, CMP is performed to remove the silicon oxide film 9 on the silicon nitride film 3.

Figure 8D:
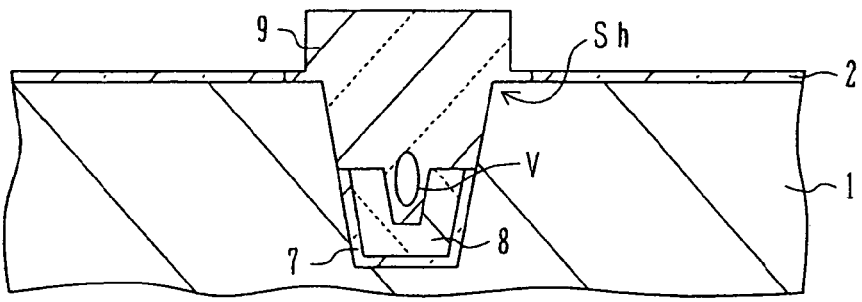

As shown in FIG. 8D, the silicon nitride film 3 is removed by hot phosphoric acid. As shown, the shoulder Sh of the active region is covered with the silicon oxide film 9. Even if the silicon oxide film 9 is etched later when the silicon oxide film is etched by dilute hydrofluoric acid, it can prevent the formation of a divot at the corner of STI.

FIGS. 9A to 9E show the measurement results of a change in the drain current of each of samples having the structure that the liner silicon nitride film is sunk by a distance below the silicon substrate surface.

Figure 9A:
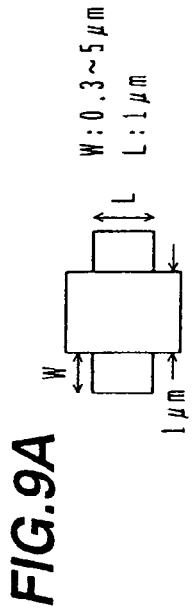
FIGS. 9A to 9E are graphs showing measurement results of samples.

FIG. 9A shows the plan shape of each sample. The width L of an active region is 1 μm and the gate length of a gate electrode is 1 μm. A width W of the source/drain region in the current direction was changed in the range of 0.3 to 5 μm. In the cross sectional structure, the silicon nitride film of the STI structure is sunk below (recessed from) the substrate surface as in the embodiments, samples having different recess amounts were formed, and a MOS transistor was formed in the active region.

Figure 9B:
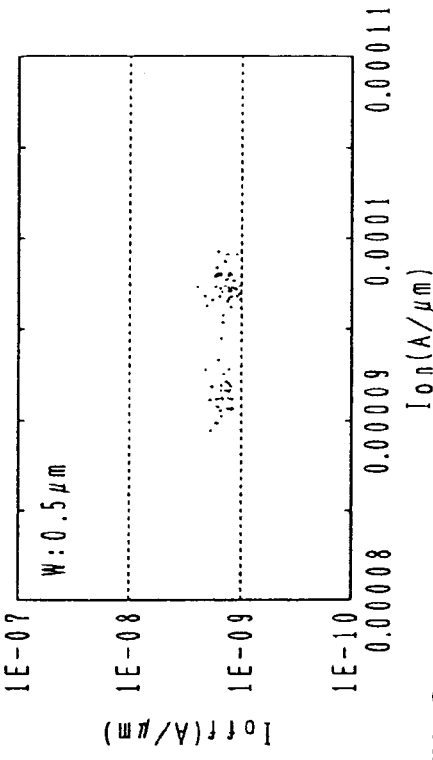

FIG. 9B shows the measurement results of samples when the width W of the source/drain region in the current direction was set to 0.3 μm. In FIG. 9B, the abscissa represents a drain current Ion of a MOS transistor in an on-state, and the ordinate represents a drain current Ioff of the MOS transistor in an off-state.

"No liner" indicates a sample without a liner of a silicon nitride film. "Recess 0 nm" indicates a sample with a silicon nitride film liner not recessed. "Recess 50 nm" and "Recess 100 nm" indicate samples whose silicon nitride film liner are recessed by 50 nm and 100 nm, respectively.

As seen from FIG. 9B, if the liner is formed, the on-current Ion increases, and as the recess becomes deeper, the on-current Ion increases.

Figure 9C:
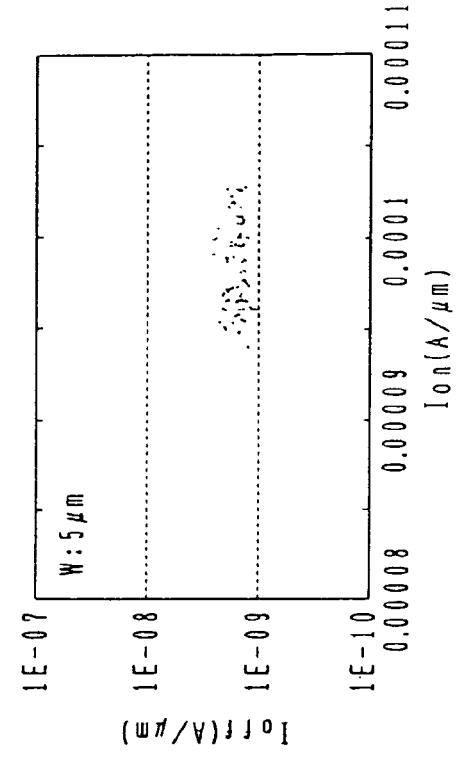
Figure 9D:
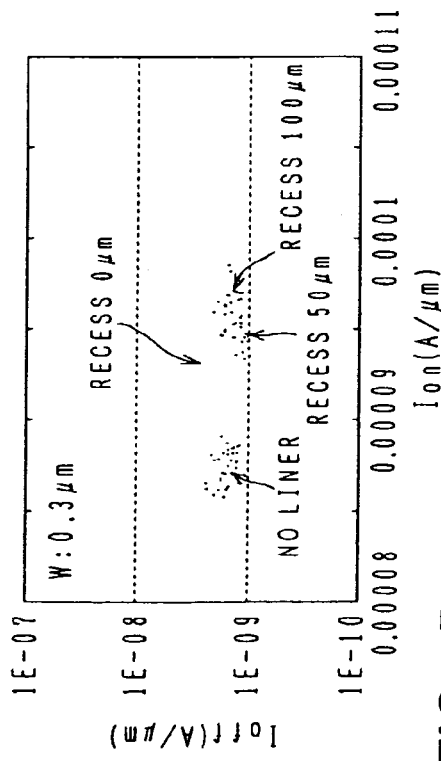
Figure 9E:
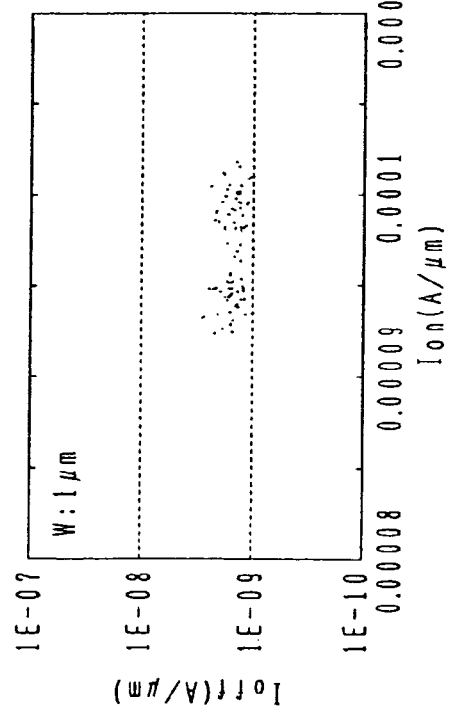

FIGS. 9C, 9D and 9E show the measurement results of samples whose widths W of the drain/source region are 0.5 μm, 1 μm and 5 μm, respectively.

It can be observed as if the liner effects are reduced as the width W of the source/drain region becomes wider. However, the formation of the silicon nitride film liner results in a definite increase in the drain current Ion. Dependency on the recess amount can also be observed. From these results, it can be said that the analysis results shown in FIG. 1 are generally correct.

Figure 10:
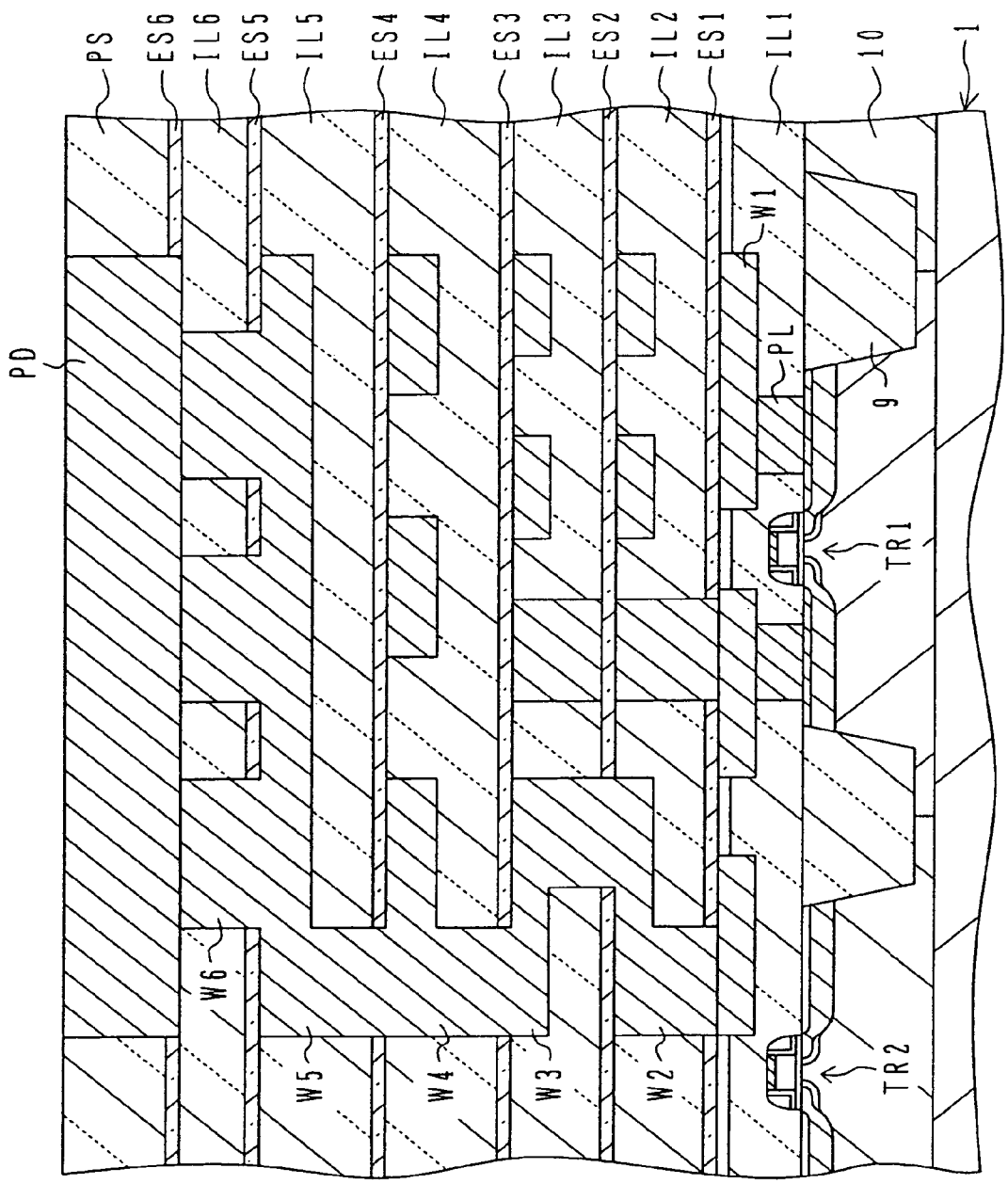
FIG. 10 is a cross sectional view schematically showing the structure of a semiconductor integrated circuit device.
Figure 11A:
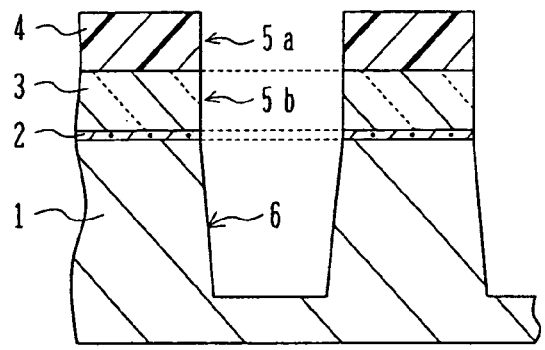
FIGS. 11A to 11G are cross sectional views illustrating a conventional STI forming method.
Figure 11B:
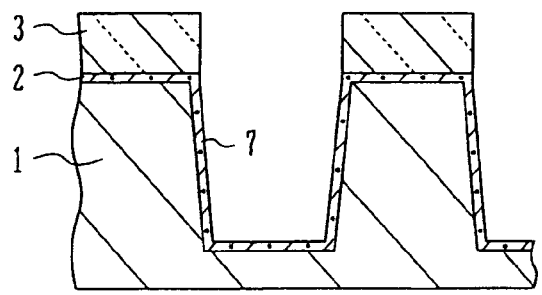
Figure 11C:
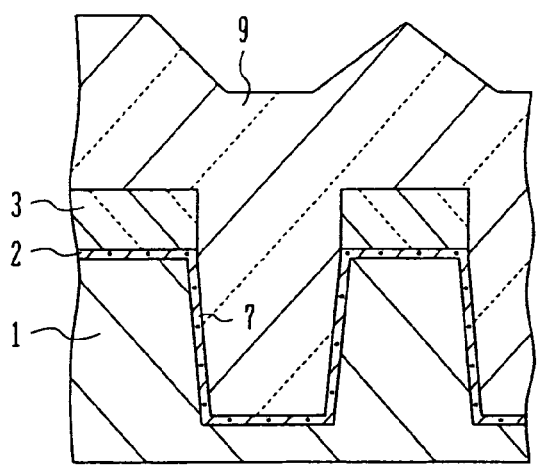
Figure 11D:
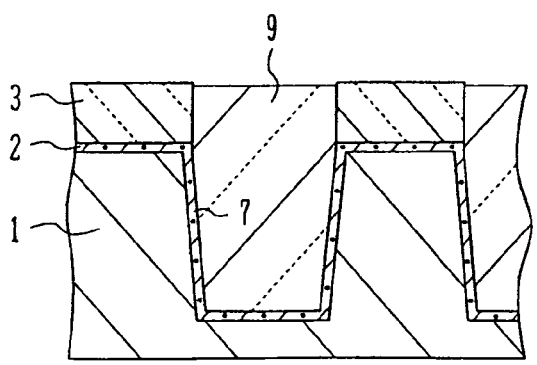
Figure 11E:
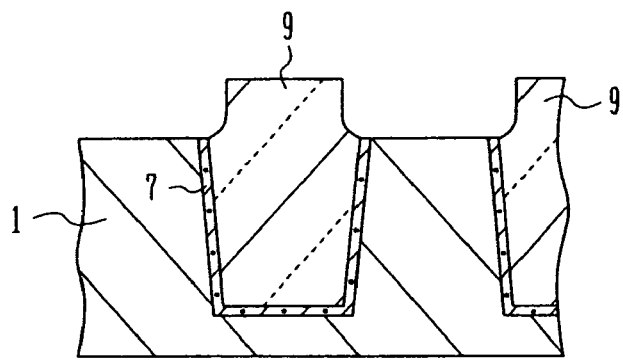
Figure 11F:
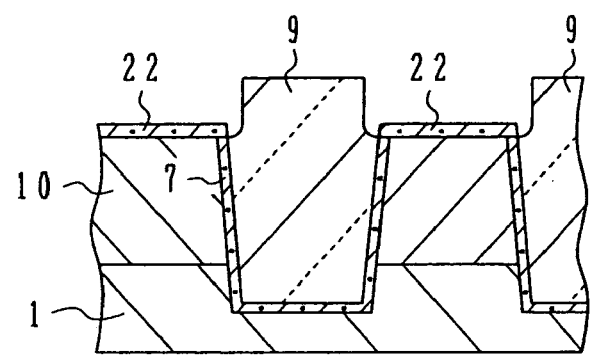
Figure 11G:
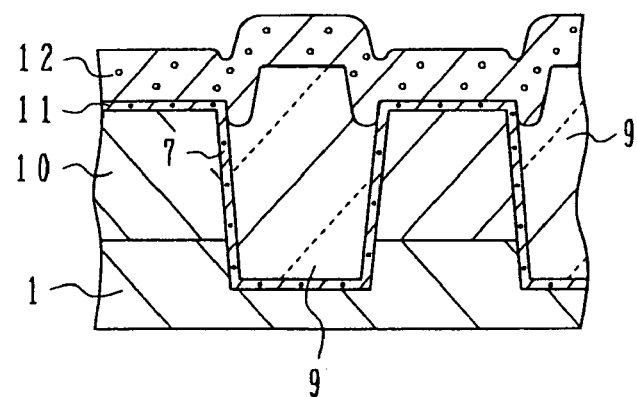

FIG. 10 is a cross sectional view showing the structure of an integrated circuit device having MOS transistors formed by the embodiments.

In the surface layer of a silicon substrate 1, an isolation trench is formed to provide a shallow trench isolation (STI) 9. In the active regions defined by STI, transistors TR1 and TR2 are formed. These STI and transistors are formed by any one of the above-described embodiments.

A first interlayer insulating film IL1 is formed burying the transistors, and a first wiring layer W1 is embedded or buried in grooves formed in the first interlayer insulating film IL1. An etch stopper layer ES1 of a silicon nitride film or the like is formed on the first wiring layer W1, and a second interlayer insulating film IL2 is formed on the etch stopper layer ES1. A second wiring layer W2 having a damascene structure is formed through the second interlayer insulating film IL2 and etching stopper layer ES1.

Similarly, an etch stopper layer ES2 is formed on the second interlayer insulating film IL2, and on this etch stopper layer ES2 a lamination structure is formed which is constituted of an interlayer insulating film IL3, an etch stopper layer ES3, an interlayer insulating film IL4, an etch stopper layer ES4, an interlayer insulating film IL5, an etch stopper layer ES5, an interlayer insulating film IL6 and an etch stopper layer ES6. On this lamination structure, a passivation film PS is formed. Wiring layers W3, W4, W5 and W6 are formed through these insulating layers. Contact pads PD are formed on the uppermost layer. Multi-layer wiring can be formed by many known processes.

The present invention has been described in connection with the preferred embodiments. The invention is not limited only to the above embodiments. It will be apparent to those skilled in the art that other various modifications, improvements, combinations, and the like can be made.

I claim:

1. A semiconductor device comprising:

a semiconductor substrate;

an isolation trench formed under a surface of said semiconductor substrate;

a liner of a silicon nitride film covering a lower inner surface of said isolation trench retracted below the surface of said semiconductor substrate;

a silicon oxide film burying said isolation trench and having a void in a region surrounded by said liner of the silicon nitride film; and active regions defined by said isolation trench.

2. The semiconductor device according to claim 1, wherein said liner of the silicon nitride film is retracted below the surface of said semiconductor substrate by 80 nm to 150 nm.

3. The semiconductor device according to claim 1, wherein said liner of the silicon nitride film have a thickness of 20 nm to 40 nm.

4. The semiconductor device according to claim 1, wherein said silicon oxide film covers a corner of said active region.

5. The semiconductor device according to claim 1, wherein a width of said isolation trench is 100 nm or narrower.

* * * * *